(12) United States Patent
Ikeda et al.

(10) Patent No.: US 6,897,600 B2
(45) Date of Patent: May 24, 2005

(54) PIEZOELECTRIC/ELECTROSTRICTIVE DEVICE

(75) Inventors: Koji Ikeda, Hisai (JP); Kazuyoshi Shibata, Mizunami (JP)

(73) Assignee: NGK Insulators, Ltd., Nagoya (JP)

( * ) Notice: Subject to any disclaimer, the term of this patent is extended or adjusted under 35 U.S.C. 154(b) by 35 days.

(21) Appl. No.: 10/236,864

(22) Filed: Sep. 6, 2002

(65) Prior Publication Data

US 2003/0062805 A1 Apr. 3, 2003

Related U.S. Application Data

(60) Provisional application No. 60/322,185, filed on Sep. 11, 2001.

(51) Int. Cl.$^7$ .............................................. H01L 41/08
(52) U.S. Cl. ...................................................... 310/331
(58) Field of Search ...................... 310/328, 330–332, 310/358, 359, 366

(56) References Cited

U.S. PATENT DOCUMENTS

| 3,590,287 A | | 6/1971 | Berlincourt et al. |
| 4,612,440 A | * | 9/1986 | Brunnee et al. ............. 250/281 |
| 5,237,239 A | | 8/1993 | Inoue et al. |
| 5,300,852 A | | 4/1994 | Isogai et al. |
| 5,500,777 A | * | 3/1996 | Hasegawa et al. ....... 360/77.16 |
| 5,507,898 A | | 4/1996 | Aoki et al. |
| 6,445,111 B2 | | 9/2002 | Watanabe et al. |
| 6,455,981 B1 | * | 9/2002 | Takeuchi et al. ............ 310/324 |
| 6,476,539 B1 | | 11/2002 | Takeuchi et al. |
| 6,590,316 B2 | | 7/2003 | Koike et al. |

FOREIGN PATENT DOCUMENTS

| EP | 1 089 357 A2 | 4/2001 |
| JP | 2-262383 | 10/1990 |
| JP | 2001320103 A | 11/2001 |

* cited by examiner

*Primary Examiner*—Mark Budd
(74) *Attorney, Agent, or Firm*—Burr & Brown

(57) ABSTRACT

A piezoelectric/electrostrictive device includes a ceramic substrate having a pair of mutually opposing thin plate sections, a fixed section for supporting the thin plate sections, and movable sections disposed at ends of the pair of thin plate sections. The piezoelectric/electrostrictive device has a portion of each movable section opposed to the fixed section, the portion being formed in a stepped form so that respective attachment surfaces are provided with steps. Cutouts (cutaways) are formed at portions of an inner wall of the fixed section near the thin plate sections. Further, steps are provided on inner walls of the cutouts disposed on the sides of the thin plate sections.

4 Claims, 5 Drawing Sheets

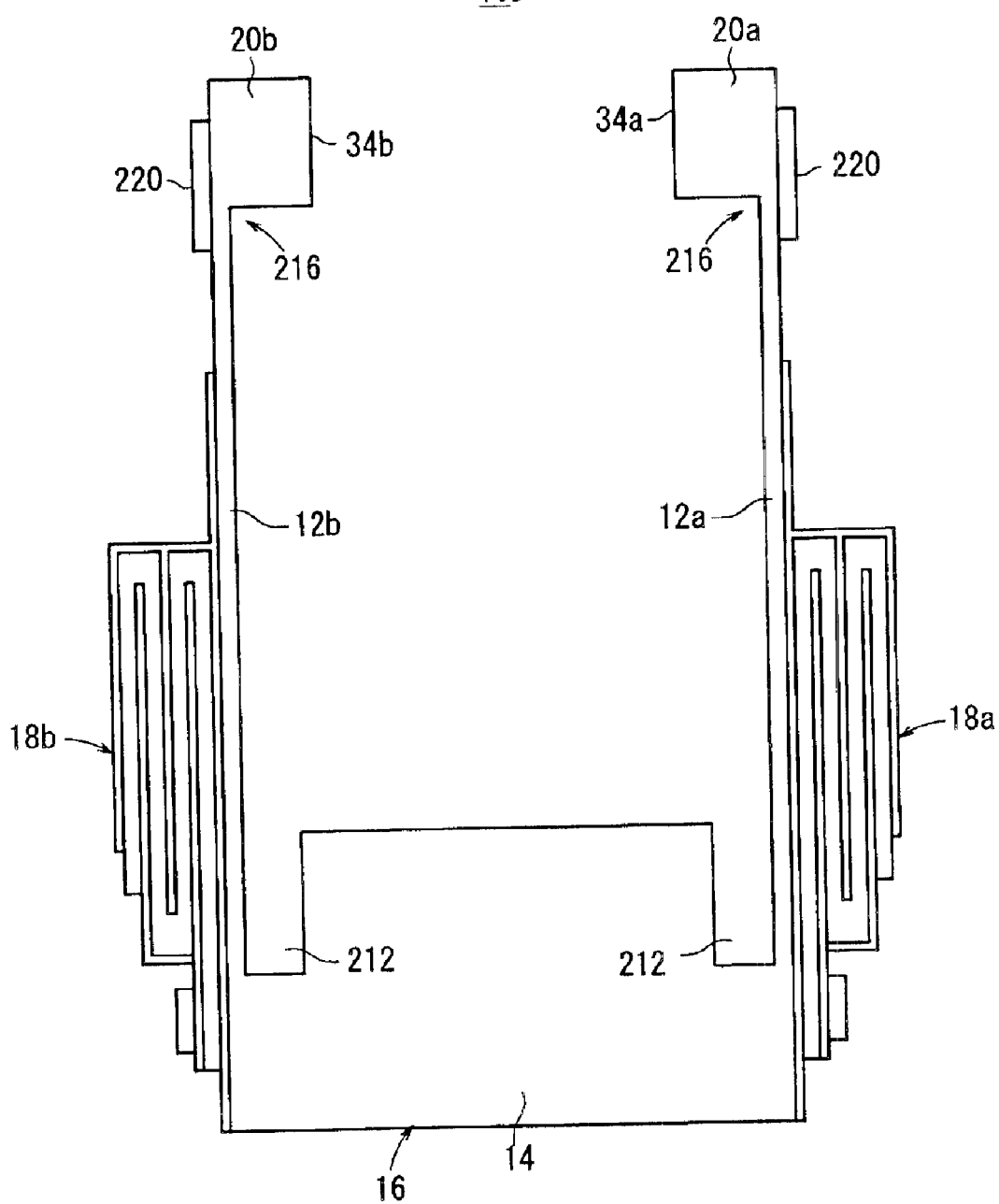

PIEZOELECTRIC/ELECTROSTRICTIVE DEVICE

BACKGROUND OF THE INVENTION

1. Field of the Invention

The present invention relates to a piezoelectric/electrostrictive device comprising a ceramic substrate having a pair of mutually opposing thin plate sections, a fixed section for supporting the thin plate sections, and movable sections disposed at ends of the pair of thin plate sections.

2. Description of the Related Art

In the present art a piezoelectric/electrostrictive device such as an actuator element or a sensor element, which uses a piezoelectric/electrostrictive layer, is produced as follows. A wiring pattern made of one electrode layer is formed on a ceramic substrate by printing, for example. A piezoelectric/electrostrictive layer is further formed thereon by printing, followed by sintering to fix the layer After that, a wiring pattern made of another electrode layer is formed (see, for example, Japanese Laid-Open Patent Publication No. 2001-320 103).

The piezoelectric/electrostrictive device can be used as an actuator element in which an electric field is applied to the piezoelectric/electrostrictive layer by supplying an electric signal to the wiring pattern so that the piezoelectric/electrostrictive layer is consequently displaced. The device can be also used as a sensor element in which an electric signal generated depending on the pressure applied to the piezoelectric/electrostrictive layer is outputted from the wiring pattern.

SUMMARY OF THE INVENTION

It is an object of the present invention to provide the piezoelectric/electrostrictive device which makes it possible to enhance shock resistance.

According to the present invention, there is provided a piezoelectric/electrostrictive device comprising a ceramic substrate having a pair of mutually opposing thin plate sections, a fixed section for supporting the thin plate sections, and movable sections disposed at ends of the pair of thin plate sections. At least one step is formed on an inner wall of at least one of the thin plate sections and the step is integrated into one unit together with at least one of the movable sections.

Accordingly, the number of stress concentration points is increased at the boundary portion between the thin plate section and the movable section so that the stress concentration points are dispersed. Thus, it is possible to decrease the stress which would be otherwise concentrated on each spot, and it is possible to enhance the shock resistance.

The height of the step is desirably not more than the thickness d provided that the thickness of the thin plate sections is d. The height of the step is preferably not more than d/2. Specifically, the height of the step is desirably within a range of 2 μm to 100 μm and preferably within a range of 5 μm to 70 μm.

The length of the step is desirably not less than d/2. Specifically, the length of the step is not less than 2 μm, preferably not less than 10 μm, and more preferably not less than 50 μm.

According to another aspect of the present invention, there is provided a piezoelectric/electrostrictive device comprising a ceramic substrate having a pair of mutually opposing thin plate sections, a fixed section for supporting the thin plate sections, and movable sections disposed at ends of the pair of thin plate sections. A boundary portion between each of the movable sections and each of the thin plate sections is formed in a curved form.

Accordingly, it is possible to eliminate the stress concentration point at the boundary portion between the thin plate section and the movable section, and it is possible to enhance the shock resistance.

The boundary portion, which is formed in the curved form, desirably has a radius of curvature of not less than 5 μm. The radius of curvature is preferably not less than 10 μm and more preferably not less than 20 μm.

According to still another aspect of the present invention, there is provided a piezoelectric/electrostrictive device comprising a ceramic substrate having a pair of mutually opposing thin plate sections, a fixed section for supporting the thin plate sections, and movable sections disposed at ends of the pair of thin plate sections. A boundary portion between each of the movable sections and each of the thin plate sections is formed to have an obtuse angle.

Accordingly, the number of stress concentration points is increased at the boundary portions between the thin plate sections and the movable sections so that the stress concentration points are dispersed. Thus, it is possible to decrease the stress which would be otherwise concentrated on each spot, and it is possible to enhance the shock resistance.

According to still another aspect of the present invention, there is provided a piezoelectric/electrostrictive device comprising a ceramic substrate having a pair of mutually opposing thin plate sections, a fixed section for supporting the thin plate sections, and movable sections disposed at ends of the pair of thin plate sections. An end surface of each of the movable sections is deviated toward the fixed section as compared with a tip surface of each of the thin plate sections.

Accordingly, when a component is interposed between the movable sections, the movable sections define the amount (thickness) and the position (adhesion area) of the adhesive for attachment.

According to still another aspect of the present invention, there is provided a piezoelectric/electrostrictive device comprising a ceramic substrate having a pair of mutually opposing thin plate sections, a fixed section for supporting the thin plate sections, and movable sections disposed at ends of the pair of thin plate sections. In each of the thin plate sections, a boundary portion between each of the movable sections and the thin plate sections is thick.

Accordingly, the strength is increased at the boundary portions between the thin plate sections and the movable sections. Thus, it is possible to enhance the shock resistance.

To thicken the boundary portions, a reinforcing member is preferably formed at a position corresponding to the boundary portion on an outer side surface of each of the thin plate sections.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 5 is a front view illustrating a piezoelectric/electrostrictive device according to a fourth embodiment.

DETAILED DESCRIPTION OF THE INVENTION

Illustrative embodiments of the piezoelectric/electrostrictive device according to the present invention will be explained below with reference to FIGS. 1 to 5.

The piezoelectric/electrostrictive device 10 according to the first embodiment includes a device or element for converting between electric energy and mechanical energy by using a piezoelectric/electrostrictive element. The piezoelectric/electrostrictive device 10 is most preferably used as an active element such as a variety of actuators and vibrators, especially as a displacement element based on the use of an inverse piezoelectric effect and an electrostrictive effect. Furthermore, the piezoelectric/electrostrictive device 10 is also preferably used as a passive element such as acceleration sensor elements and shock sensor elements.

Figure 1:
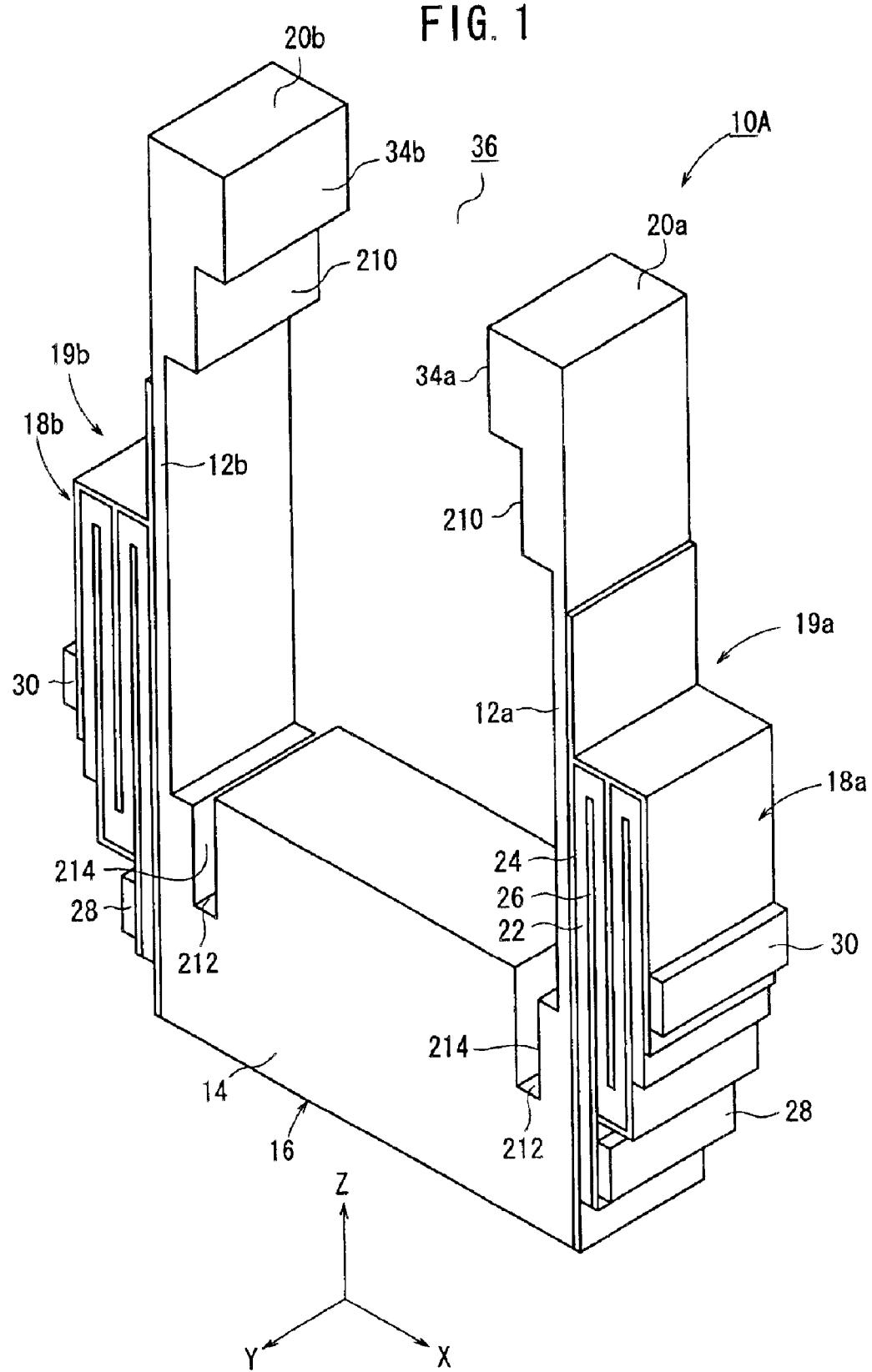
FIG. 1 is a perspective view illustrating an arrangement of a piezoelectric/electrostrictive device according to a first embodiment.

As shown in FIG. 1, a piezoelectric/electrostrictive device 10A according to a first embodiment has a ceramic substrate 16 integrally comprising a pair of mutually opposing thin plate sections 12a, 12b, and a fixed section 14 for supporting the thin plate sections 12a, 12b. Piezoelectric/electrostrictive elements 18a, 18b are formed on part of the pair of thin plate sections 12a, 12b respectively.

In the piezoelectric/electrostrictive device 10A, the pair of thin plate sections 12a, 12b are displaced in accordance with the driving of the piezoelectric/electrostrictive elements 18a, 18b, or the displacement of the thin plate sections 12a, 12b is detected by the piezoelectric/electrostrictive elements 18a, 18b. Therefore, in the illustrative device shown in FIG. 1, functional sections or operating sections 19a, 19b are constructed by the thin plate sections 12a, 12b and the piezoelectric/electrostrictive elements 18a, 18b. Accordingly, the pair of thin plate sections 12a, 12b function as vibrating sections which can be vibrated while supported by the fixed section 14.

Each of the ends of the pair of thin plate sections 12a, 12b is inwardly thick-walled. The thick-walled portions function as movable sections 20a, 20b which are displaceable in accordance with the displacing action of the thin plate sections 12a, 12b. The thick-walled portions (including projections as the shape of the portions), which protrude mutually inwardly at the ends of the pair of thin plate sections 12a, 12b, are hereinafter referred to as movable sections 20a, 20b.

A gap (air) 36 may be interposed between mutually opposing end surfaces 34a, 34b of the movable sections 20a, 20b. Alternatively, although not shown, a plurality of members which are made of the same material as, or different material from, the constitutive material of the movable sections 20a, 20b may be interposed between the end surfaces 34a, 34b. In this arrangement, the mutually opposing end surfaces 34a, 34b of the respective movable sections 20a, 20b function as attachment surfaces 34a, 34b. Therefore, the end surfaces 34a, 34b are also referred to as attachment surfaces 34a, 34b.

The ceramic substrate 16 is composed of a ceramic laminate. For example, several ceramic green sheets are laminated, sintered, and integrated into the ceramic laminate. This feature will be described later on.

The integrated ceramics as described above scarcely suffers from changes over time, because no adhesive exists on joined portions of the respective parts. Therefore, the joined portions are highly reliable, and the structure is advantageous to ensure the rigidity. Further, such integrated ceramics can be produced with ease in accordance with the ceramic green sheet-laminating method as described later.

The piezoelectric/electrostrictive elements 18a, 18b are prepared separately from the ceramic substrate 16 as described later. The piezoelectric/electrostrictive elements 18a, 18b are directly formed on the ceramic substrate 16 by the film formation method.

Each of the piezoelectric/electrostrictive elements 18a, 18b comprises a piezoelectric/electrostrictive layer 22, and a pair of electrodes 24, 26 formed on both sides of the piezoelectric/electrostrictive layer 22. The first electrode 24 of the pair of electrodes 24, 26 is formed at least on each of the pair of thin plate sections 12a, 12b.

In the embodiment of the present invention, each of the piezoelectric/electrostrictive layer 22 and the pair of electrodes 24, 26 has a multilayered structure. The first electrode 24 and the second electrode 26 are alternately stacked such that a comb-shaped cross section is obtained, and the first electrode 24 and the second electrode 26 are stacked with each other with the piezoelectric/electrostrictive layer 22 interposed therebetween. As a result, the piezoelectric/electrostrictive elements 18a, 18b are constructed in multiple stages in the multilayered structure. However, the present invention is not limited to the multilayered structure as described above. A single-layered structure is also applicable in this invention.

Next, the elements of the piezoelectric/electrostrictive device 10A according to the first embodiment will be explained.

As described above, the movable sections 20a, 20b serve as parts which are operated based on the driving amounts of the thin plate sections 12a, 12b. A variety of members are attached to the movable sections 20a, 20b depending on the use of the piezoelectric/electrostrictive device 10A. For example, when the piezoelectric/electrostrictive device 10A is used as a displacement element, a shield plate for an optical shutter or the like is attached to the movable sections 20a, 20b. Especially, when the piezoelectric/electrostrictive device 10A is used for the positioning of a magnetic head of a hard disk drive or for a ringing-suppressing mechanism, a member required to be positioned is attached to the movable sections 20a, 20b, such as a magnetic head, a slider provided with a magnetic head, and a suspension provided with a slider.

As described above, the fixed section 14 serves as a part which supports the thin plate sections 12a, 12b and the movable sections 20a, 20b. For example, when the piezoelectric/electrostrictive device 10A is utilized to position a magnetic head of a hard disk drive, the fixed section 14 is supported by, for example, a carriage arm attached to VCM (voice coil motor) or a suspension or a fixed plate attached to the carriage arm. Accordingly, the entire piezoelectric/electrostrictive device 10A is fixed. Further, as shown in FIG. 1, the connecting terminals 28, 30 and other members for driving the piezoelectric/electrostrictive elements 18a, 18b may be arranged on the fixed section 14.

Materials of the movable sections 20a, 20b and the fixed section 14 are not specifically limited as long as the materials have certain rigidity. However, the ceramics, to which the ceramic green sheet-laminating method is applicable, can be preferably used as described above.

Specifically, proposed materials include a major component such as zirconia represented by fully stabilized zirconia or partially stabilized zirconia, alumina, magnesia, silicon nitride, aluminum nitride, or titanium oxide. Further, materials containing a major component of a mixture of the foregoing components are also proposed. However, it is preferable to use a material containing zirconia, especially fully stabilized zirconia as a major component or a material containing partially stabilized zirconia as a major component, in view of high mechanical strength and high toughness.

As described above, the thin plate sections 12a, 12b serve as parts which are driven in accordance with the displacement of the piezoelectric/electrostrictive elements 18a, 18b. Each of the thin plate sections 12a, 12b is a thin plate-shaped member having flexibility. The thin plate sections 12a, 12b function to amplify the expansion and shrink displacement of the piezoelectric/electrostrictive element 18a, 18b arranged on the surface thereof to obtain bending displacement, and transmit the bending displacement to the movable section 20a, 20b. The shape and the material quality of the thin plate sections 12a, 12b are selected seeking for enough flexibility and mechanical strength not to be broken due to any bending deformation. The shape and the material quality of the thin plate sections 12a, 12b may also be appropriately selected in consideration of the response performance and the operability of the movable section 20a, 20b.

Similar ceramic materials can be preferably used for the material of the thin plate sections 12a, 12b, to the ceramic materials of the movable sections 20a, 20b and the fixed section 14. A material containing fully stabilized zirconia as a major component or a material containing partially stabilized zirconia as a major component is used most preferably, because the mechanical strength is large even when a thin-walled member is formed therefrom, toughness is high, and the reactivity with the piezoelectric/electrostrictive layer and the electrode material is small.

The fully stabilized zirconia and the partially stabilized zirconia are preferably fully stabilized or partially stabilized as follows. Chemical compounds which fully stabilize and/or partially stabilize zirconia include yttrium oxide, ytterbium oxide, cerium oxide, calcium oxide, and magnesium oxide. Zirconia can be stabilized as desired, by containing at least one of the foregoing compounds, or by adding the foregoing compounds in combination as well.

It is desirable that the respective compounds are added in the following amounts, i.e., 1 to 30 mole %, preferably 1.5 to 10 mole % in the case of yttrium oxide or ytterbium oxide, 6 to 50 mole %, preferably 8 to 20 mole % in the case of cerium oxide, and 5 to 40 mole %, preferably 5 to 20 mole % in the case of calcium oxide or magnesium oxide. Among them, it is especially preferable to use yttrium oxide as a stabilizer. In this case, it is desirable that yttrium oxide is preferably added in a amount of 1.5 to 10 mole %, and more preferably 2 to 4 mole %. It is possible to add, for example, alumina, silica, and/or oxide of transition metal as an additive of a sintering aid or the like within a range of 0.05 to 20% by weight. However when the piezoelectric/electrostrictive elements 18a, 18b are formed by sintering and integrating materials into one unit by the film formation method, it is also preferable to add, for example, alumina, magnesia, and/or oxide of transition metal as an additive.

In order to obtain high mechanical strength and stable crystal phase, it is desirable that the average crystal grain size of zirconia is 0.05 to 3 µm, preferably 0.05 to 1 µm. As described above, ceramic materials which are similar to those of the movable sections 20a, 20b and the fixed section 14 can be used for the thin plate sections 12a, 12b. It is preferable that the thin plate sections 12a, 12b are made by using substantially the same material. This is advantageous in that the reliability of the joined portions is improved, the strength of the piezoelectric/electrostrictive device 10A is enhanced, and the complexity of production is reduced.

Each of the piezoelectric/electrostrictive elements 18a, 18b has at least the piezoelectric/electrostrictive layer 22 and the pair of electrodes 24, 26 for applying the electric field to the piezoelectric/electrostrictive layer 22. The piezoelectric/electrostrictive elements 18a, 18b can be used, for example, as a unimorph type or a bimorph type. However, the piezoelectric/electrostrictive element of the unimorph type, which is used with the thin plate sections 12a, 12b in combination, is more excellent in stability of the generated displacement amount, and it is more advantageous to reduce weight of the device. Therefore, the piezoelectric/electrostrictive element of the unimorph type is more suitable for the piezoelectric/electrostrictive device 10A.

It is preferable that the piezoelectric/electrostrictive elements 18a, 18b are formed on the side surfaces of the thin plate sections 12a, 12b as shown in FIG. 1, since the thin plate sections 12a, 12b can be driven more greatly.

Piezoelectric ceramic materials are preferably used for the piezoelectric/electrostrictive layer 22. However, it is also possible to use electrostrictive ceramic materials, ferroelectric ceramic materials, and anti-ferroelectric ceramic materials. When the piezoelectric/electrostrictive device 10A is used to position the magnetic head of the hard disk drive, for example, it is preferable to use a piezoelectric material having small strain hysteresis, and/or it is preferable to use a material having a coercive electric field of not more than 10 kV/mm, because the linearity between the displacement amount of the movable section 20a, 20b and the driving voltage or the output voltage is important.

Specifically, piezoelectric materials may include lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, and strontium bismuth tantalate. One of these materials can be used, or any appropriate mixture or the like of them can be used.

Especially, a material containing lead zirconate, lead titanate, or lead magnesium niobate as a major component, or a material containing sodium bismuth titanate as a major component is preferably used, since such materials have a high electromechanical coupling factor and a high piezoelectric constant. Further, the reactivity with the thin plate section (ceramics) 12a, 12b of such materials is small when the piezoelectric/electrostrictive layer 22 is sintered so that a device of a stable composition can be obtained.

It is also possible to use a ceramic material obtained by adding to the piezoelectric material described above any one of or a mixture of, for example, oxide of lanthanum, oxide of calcium, oxide of strontium, oxide of molybdenum, oxide of tungsten, oxide of barium, oxide of niobium, oxide of zinc, oxide of nickel, oxide of manganese, oxide of cerium, oxide of cadmium, oxide of chromium, oxide of cobalt, oxide of antimony, oxide of iron, oxide of yttrium, oxide of tantalum, oxide of lithium, oxide of bismuth, and oxide of stannum.

For example, when lanthanum and/or strontium is contained in major components such as lead zirconate, lead titanate, and lead magnesium niobate, coercive electric field and piezoelectric characteristics may be adjustable, which is advantageous.

It is desirable that a material such as silica which tends to form glass is added in an amount of not more than 2% by weight with respect to the piezoelectric/electrostrictive material. The reason why is, if such a material is added in an amount of not less than 2% by weight, the material such as silica, which serves as a sintering aid, is readily reacted with the piezoelectric/electrostrictive material during the heat treatment of the piezoelectric/electrostrictive layer 22. As a result, the composition is varied, and piezoelectric characteristics are deteriorated. If a suitable amount of silica is added, the sintering characteristics of the piezoelectric/electrostrictive member are improved, i.e., the piezoelectric/electrostrictive member may be sintered evenly.

On the other hand, it is preferable that the pair of electrodes 24, 26 of the piezoelectric/electrostrictive elements 18a, 18b are made of a metal which is solid at room temperature and which is excellent in conductivity. Materials usable for the pair of electrodes 24, 26 include metal such as aluminum, titanium, chromium, iron, cobalt, nickel, copper, zinc, niobium, molybdenum, ruthenium, palladium, rhodium, silver, stannum, tantalum, tungsten, iridium, platinum, gold, and lead, and alloys thereof. Further, it is also preferable to use a cermet material obtained by dispersing the same materials as those of the piezoelectric/electrostrictive layer 22 and/or the thin plate sections 12a, 12b in one of the metals or the alloy described above.

The material of the electrodes 24, 26 of the piezoelectric/electrostrictive element 18a, 18b is selected and determined depending on the method of forming the piezoelectric/electrostrictive layer 22. For example, when the piezoelectric/electrostrictive layer 22 is formed by sintering on the first electrode 24 after forming the first electrode 24 on the thin plate section 12a, 12b, it is necessary for the first electrode 24 to use a high melting point metal which does not change at the sintering temperature of the piezoelectric/electrostrictive layer 22. The high melting point metal includes platinum, palladium, platinum-palladium alloy, and silver-palladium alloy. However, the electrode on the outermost layer, which is formed on the piezoelectric/electrostrictive layer 22 after forming the piezoelectric/electrostrictive layer 22, can be formed at a relatively low temperature. Therefore, it is possible to use a low melting point metal as a major component of the electrode on the outermost layer, including aluminum, gold, and silver.

Each thickness of the electrodes 24, 26 may be a factor to considerably decrease the displacement of the piezoelectric/electrostrictive element 18a, 18b. Therefore, especially for the electrode formed after sintering the piezoelectric/electrostrictive layer 22, it is preferable to use a material such as an organic metal paste with which a dense and thinner film can be obtained by sintering, including gold resinate paste, platinum resinate paste, and silver resinate paste.

The piezoelectric/electrostrictive device 10A according to the first embodiment can be preferably used for a variety of sensors including ultrasonic wave sensors, acceleration sensors, angular velocity sensors, shock sensors, and mass sensors. The piezoelectric/electrostrictive device 10A according to the first embodiment is further advantageous in that the sensitivity of the sensor can be easily adjusted by appropriately adjusting the size of an object attached between the end surfaces 34a, 34b or between the thin plate sections 12a, 12b.

As for the method of forming the piezoelectric/electrostrictive element 18a, 18b on the surface of the thin plate section 12a, 12b, it is possible to use a thick film formation method such as dipping method, application method, and electrophoresis method and a thin film formation method such as ion beam method, sputtering method, vacuum deposition, ion plating method, chemical vapor deposition method (CVD), and plating, as well as the screen printing method described above.

When the piezoelectric/electrostrictive elements 18a, 18b are formed by using one of the film formation methods as described above, the piezoelectric/electrostrictive elements 18a, 18b and the thin plate sections 12a, 12b can be joined and arranged integrally without using any adhesive. It is possible to ensure the reliability and the reproducibility of the device, and it is possible to facilitate integration thereof.

In this embodiment, it is preferable that the piezoelectric/electrostrictive elements 18a, 18b are formed by the thick film formation method, for the following reason. When the thick film formation method is used especially for the formation of the piezoelectric/electrostrictive layer 22, the film can be formed by using, for example, a paste, a slurry, a suspension, an emulsion, or a sol, containing grains or powder of piezoelectric ceramics having an average grain size of 0.01 to 5 $\mu$m, preferably 0.05 to 3 $\mu$m, as a major component. When the film obtained as described above is sintered, it is possible to obtain good piezoelectric/electrostrictive characteristics.

The electrophoresis method is advantageous since the film can be formed at a high density with a high shape accuracy. The screen printing method is advantageous to simplify production steps, because the film formation and the pattern formation can be performed simultaneously.

Figure 2:
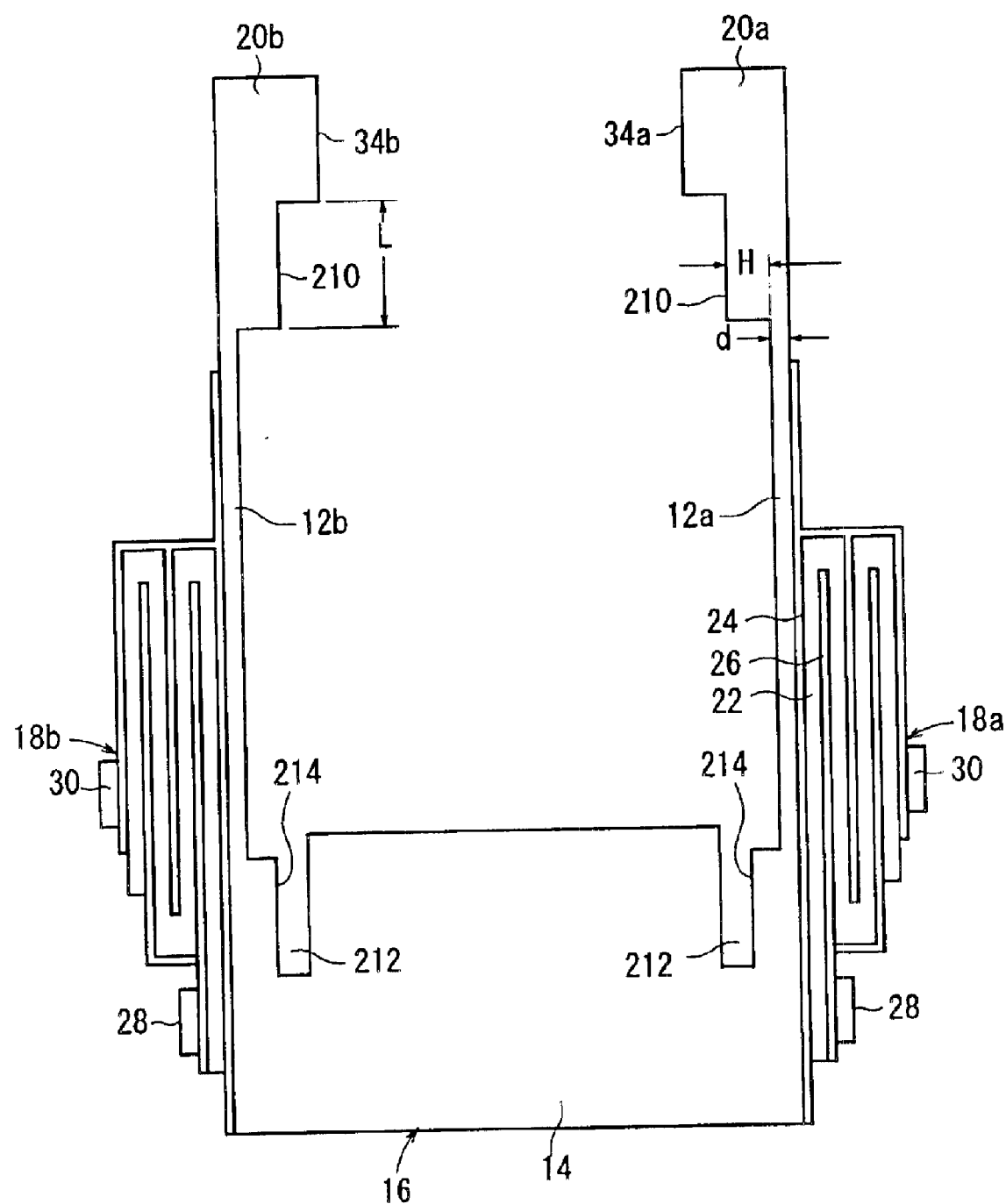
FIG. 2 is a front view illustrating the piezoelectric/electrostrictive device according to the first embodiment.

As shown in FIGS. 1 and 2, in the piezoelectric/electrostrictive device 10A according to the first embodiment, the portions of the movable sections 20a, 20b opposed to the fixed section 14 are formed in a stepped form. Steps 210 are provided on the respective attachment surfaces 34a, 34b. Cutouts (cutaways) 212 are formed at portions of the inner wall of the fixed section 14 near the thin plate sections 12a, 12b. Further, steps 214 are provided on inner walls of the cutouts 212 disposed on the sides of the thin plate sections 12a, 12b. The attachment surfaces 34a, 34b of the movable sections serve as portions to which a component may be attached depending on the use of the piezoelectric/electrostrictive device 10A.

In this the structure as described above, the stress is dispersed at the boundary portions between the thin plate sections 12a, 12b and the movable sections 20a, 20b and at the boundary portions between the thin plate sections 12a, 12b and the fixed section 14. Accordingly, it is possible to decrease the stress which would be otherwise concentrated on each spot. Further, it is possible to enhance shock resistance.

Each number of steps 210, 214 is preferably not less than 1 in each case. With reference to FIG. 2, the height H of the step 210, 214 is desirably not more than the thickness d of the thin plate section 12a, 12b, and it is preferably not more than d/2. Specifically, the height H is desirably within a range of 2 $\mu$m to 100 $\mu$m and preferably within a range of 5 $\mu$m to 70 $\mu$m.

With reference to FIG. 2, the length L of the step 210 is desirably not less than d/2. Specifically, the length L is not less than 2 $\mu$m, preferably not less than 10 $\mu$m, and more preferably not less than 50 $\mu$m. If the length L is too long, the displacement is decreased. However, the resonance frequency tends to increase inversely.

In order to produce the piezoelectric/electrostrictive device 10A having the steps 210, 214 as described above, the ceramic substrate 16 is prepared by sintering the ceramic green laminate. Alternatively, the ceramic substrate 16 is prepared by forming a pattern on a green sheet by the partial printing, thereafter laminating the green sheets to prepare the ceramic green laminate, and sintering the ceramic green laminate.

Figure 3:
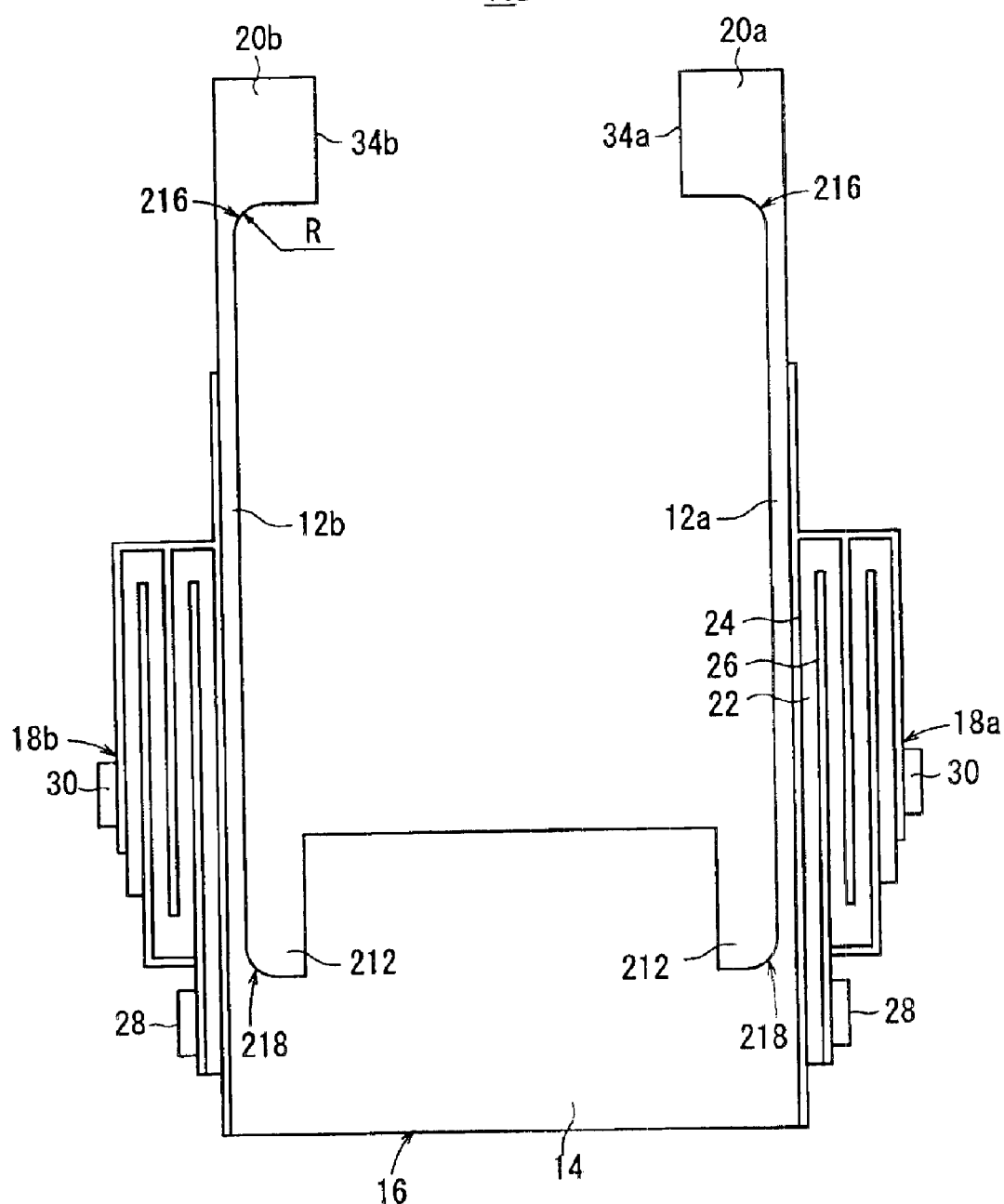
FIG. 3 is a front view illustrating a piezoelectric/electrostrictive device according to a second embodiment.

Next, as shown in FIG. 3, a piezoelectric/electrostrictive device 10B according to a second embodiment is structured in approximately the same manner as the piezoelectric/electrostrictive device 10A according to the first embodiment described above. The differences between these embodiments are as follows. Boundary sections 216 between the movable sections 20a, 20b and the thin plate sections 12a, 12b are formed in a curved shape. Boundary sections 218 are formed in a curved shape in cutouts (cutaways) 212 provided between the fixed section 14 and the thin plate sections 12a, 12b. Particularly, the boundary sections 218 are formed between the bottoms of the cutouts 212 and the inner walls of the cutouts 212 disposed near the thin plate sections 12a, 12b.

In this structure, it is possible to disperse the stress at the boundary sections 216 between the thin plate sections 12a, 12b and the movable section 20a, 20b and at the boundary sections 218 between the thin plate sections 12a, 12b and the fixed section 14. Thus, it is possible to enhance the shock resistance.

The radius of curvature R of the curved sections (boundary sections 216, 218) is desirably not less than 5 µm, preferably not less than 10 µm, and more preferably not less than 20 µm.

In order to produce the piezoelectric/electrostrictive device 10B having the curved sections 216, 218 as described above, paste application is utilized. That is, the curved sections 216, 218 are formed by applying or dipping the paste of ceramic material onto corners (portions to be formed into the curved section 216, 218 later) when the green sheets are laminated. Accordingly, the paste forms a curved shape in accordance with surface tension. After that, the green sheets are laminated to prepare the ceramic green laminate, followed by sintering. Accordingly, it is possible to obtain the ceramic substrate 16 having the curved sections 216, 218 as shown in FIG. 3.

Another method is also proposed as follows. At first, the ceramic substrate 16 is prepared. After or during the preparation of the ceramic substrate 16, the paste or the like of resin, glass, or metal is poured into portions to be formed into the curved sections 216, 218 so that corners are formed in a curved shape.

Figure 4:
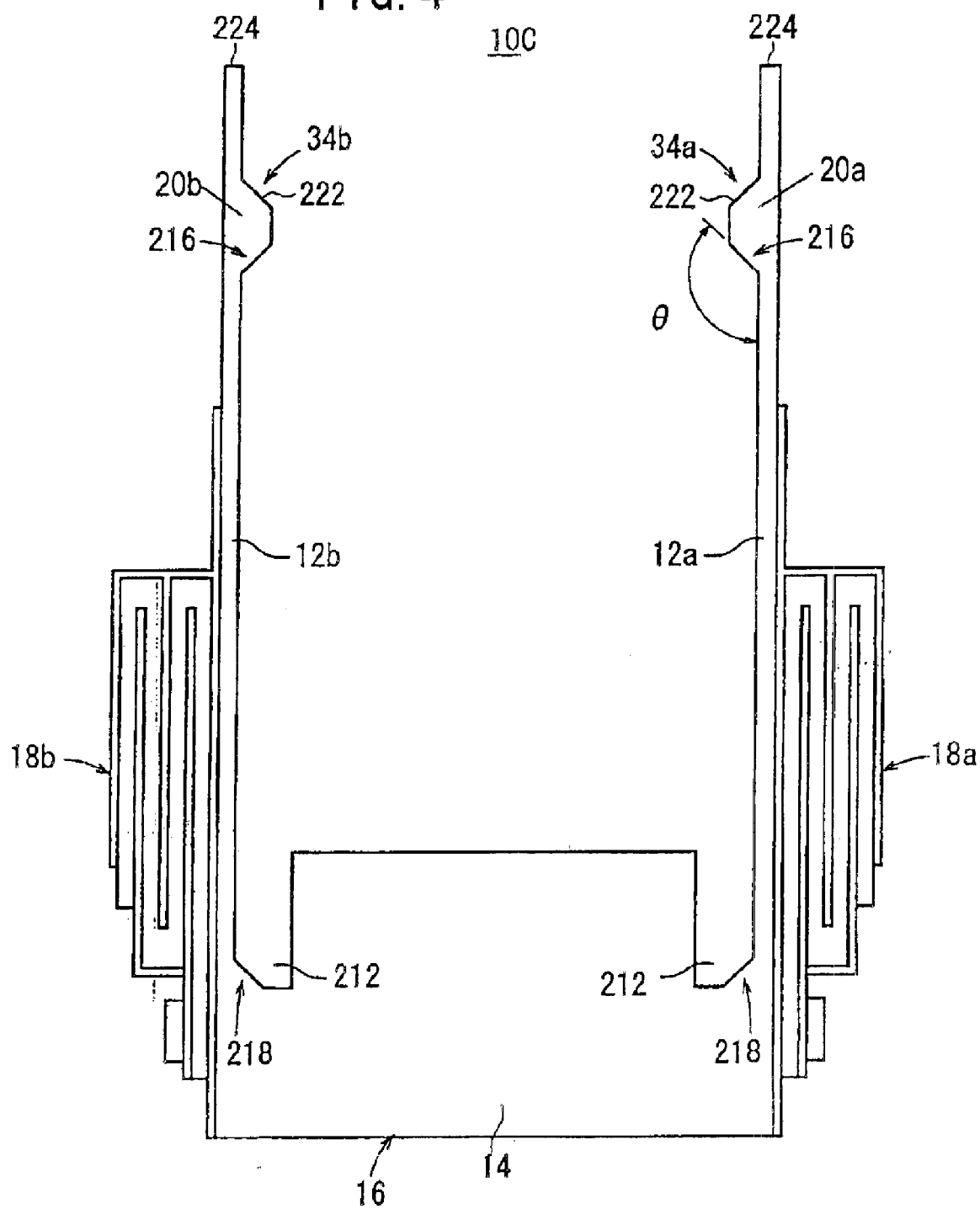
FIG. 4 is a front view illustrating a piezoelectric/electrostrictive device according to a third embodiment.

Next, as shown in FIG. 4, a piezoelectric/electrostrictive device 10C according to a third embodiment is structured in approximately the same manner as the piezoelectric/electrostrictive device 10A according to the first embodiment described above. The differences between these embodiments are as follows. The angle θ of the boundary sections 216 between the movable sections 20a, 20b and the thin plate sections 12a, 12b is formed to be an obtuse angle. The angle of the boundary sections 218 in cutouts (cutaways) 212 provided between the fixed section 14 and the thin plate sections 12a, 12b is formed to an obtuse angle. Particularly, the angle of the boundary sections 218 between the bottoms of the cutouts 212 and the inner walls of the cutouts 212 disposed near the thin plate sections 12a, 12b is formed to be an obtuse angle.

In this structure, the number of stress concentration points is increased and they are dispersed at the boundary sections 216 between the thin plate sections 12a, 12b and the movable sections 20a, 20b and at the boundary sections 218 between the thin plate sections 12a, 12b and the fixed section 14 in the same manner as in the first embodiment. Accordingly, it is possible to decrease the stress which would be otherwise concentrated on each spot, and it is possible to enhance the shock resistance.

The angle of the boundary sections 216, 218 is desirably larger than 90°, preferably not less than 135°.

In order to prepare the piezoelectric/electrostrictive device 10C according to the third embodiment, a paste is pattern-printed on the green sheet to be formed into the thin plate section 12a, 12b. The end of the pattern of the printed paste forms a tapered shape.

In other words, the green sheets are laminated so that the tapered portions of the patterns become the boundary sections 216, 218 to prepare the ceramic green laminate, and then sintered into the ceramic substrate 16. Accordingly, the angles of the boundary sections 216, 218 on the ceramic substrate 16 are formed to be the obtuse angles.

The angles can be controlled by adjusting the viscosity of the paste and/or the printing condition. Alternatively, the control can be realized by superimposing a plurality of green sheets having different lengths. The paste may be made from the same ceramic material as the material of the ceramic substrate 16. Alternatively, the paste may be made from another ceramic material, a high melting point metal, or a cermet.

As shown in FIG. 4, the piezoelectric/electrostrictive device 10C according to the third embodiment has end surfaces 222 of the movable sections 20a, 20b which are deviated toward the fixed section as compared with tip surfaces 224 of the thin plate sections 12a, 12b. Accordingly, when a component is attached between the attachment surfaces 34a, 34b, the movable sections 20a, 20b determine the amount (thickness) and the position (adhesion area) of adhesive to be used. Further, the portions of adhesive interposing between the thin plate sections 12a, 12b and the component, also function as the movable sections. The boundary surfaces between the adhesive and the component also function as the attachment surfaces of the movable sections.

Next, as shown in FIG. 5, a piezoelectric/electrostrictive device 10D according to a fourth embodiment is structured in approximately the same manner as the piezoelectric/electrostrictive device 10A according to the first embodiment described above. The differences between these embodiments are as follows. The thickness of boundary sections 216 of the thin plate sections 12a, 12b between the movable sections 20a, 20b and the thin plate sections 12a, 12b is large.

To thicken the boundary sections 216, it is preferable to form reinforcing members 220 on the side surfaces of the thin plate sections 12a, 12b corresponding to the boundary sections 216. Specifically, after the ceramic substrate 16 is prepared, for example, a paste for the reinforcing members 220 is printed by the screen printing, followed by sintering. Alternatively, the paste for the reinforcing members 220 may be printed on predetermined positions of the ceramic green laminate, followed by sintering to prepare the ceramic substrate 16.

The reinforcing member 220 may be made of the same ceramic material as that for the ceramic substrate 16. Alternatively, the reinforcing member 220 may be made of another ceramic material, metal, glass, or resin.

The piezoelectric/electrostrictive devices 10A to 10D described above can be utilized as active elements including various transducers, various actuators, frequency region functional parts (filters), transformers, and vibrators, resonators, oscillators, and discriminators for communication or power generation, as well as sensor elements of various sensors including ultrasonic wave sensors, acceleration sensors, angular velocity sensors, shock sensors, and mass sensors. Especially, the piezoelectric/electrostrictive devices 10A to 10D can be preferably utilized for various actuators to be employed in mechanisms for adjusting angles of, and for adjusting positions and displacement of various precision components in optical instruments, precision instruments and the like.

It is a matter of course that the piezoelectric/electrostrictive device according to the present invention is not limited to the embodiments described above, which may be embodied in other various forms without deviating from the gist or essential characteristics of the present invention.

What is claimed is:

1. A piezoelectric/electrostrictive device comprising a ceramic substrate having a pair of mutually opposing thin plate sections, a fixed section for supporting said thin plate sections, and movable sections disposed at ends of said pair of thin plate sections, wherein a boundary portion between each of said movable sections and each of said thin plate sections is formed in a curved form.

2. The piezoelectric/electrostrictive device according to claim 1, wherein said boundary portion is formed in said curved form and has a radius of curvature of not less than 5 $\mu$m.

3. A piezoelectric/electrostrictive device comprising a ceramic substrate having a pair of mutually opposing thin plate sections, a fixed section for supporting said thin plate sections, and movable sections disposed at ends of said pair of thin plate sections, wherein a boundary portion between each of said movable sections and each of said thin plate sections is formed to have an obtuse angle.

4. A piezoelectric/electrostrictive device comprising a ceramic substrate having a pair of mutually opposing thin plate sections, a fixed section for supporting said thin plate sections, and movable sections disposed at ends of said pair of thin plate sections, wherein a reinforcing member is formed at a position corresponding to said boundary portion on an outer side surface of each of said thin plate sections such that, in said thin plate sections, a boundary portion between each of said movable sections and each of said thin plate sections is thick.

* * * * *